United States Patent [19]

Shin et al.

[11] Patent Number: 5,629,561
[45] Date of Patent: May 13, 1997

[54] SEMICONDUCTOR PACKAGE WITH INTEGRAL HEAT DISSIPATOR

[75] Inventors: Won S. Shin, Seoul; Byung T. Do, Inchang-Dong Guri, both of Rep. of Korea

[73] Assignees: Anam Industrial Co., Ltd., Seoul, Rep. of Korea; Amkor Electronics, Inc., Chandler, Ariz.

[21] Appl. No.: 570,794

[22] Filed: Dec. 12, 1995

[30] Foreign Application Priority Data

Dec. 16, 1994 [KR] Rep. of Korea ............... 94-34663

[51] Int. Cl.⁶ .................. H01L 23/28; H01L 23/34
[52] U.S. Cl. .................. 257/712; 257/706; 257/707; 257/693; 257/675; 257/717
[58] Field of Search ................. 257/712, 706, 257/707, 717, 720, 730, 675, 693

[56] References Cited

U.S. PATENT DOCUMENTS

| | | | |
|---|---|---|---|
| 5,064,968 | 11/1991 | Kovacs et al. | 257/730 |
| 5,280,409 | 1/1994 | Selna et al. | 252/722 |
| 5,404,273 | 4/1995 | Akagawa | 257/706 |
| 5,482,898 | 1/1996 | Marrs | 437/216 |

FOREIGN PATENT DOCUMENTS

| | | | |
|---|---|---|---|
| 0222450 | 9/1988 | Japan | 257/720 |
| 0055411 | 3/1993 | Japan | 257/722 |
| 0206337 | 8/1993 | Japan | 257/712 |
| 0132415 | 5/1994 | Japan | 257/706 |

*Primary Examiner*—Sara W. Crane
*Assistant Examiner*—Alexander Oscar Williams
*Attorney, Agent, or Firm*—Skjerven, Morrill, MacPherson, Franklin & Friel LLP

[57] ABSTRACT

A highly integrated semiconductor package having a light and compact construction and heat dissipating means suitable to effectively dissipate heat generated from the package during the operation of the package is disclosed. The semiconductor package has a lower heat sink for dissipating heat generated from a semiconductor chip of the package. The package also has a tape attached to the top of a plurality of inner leads of the package. The inner leads are attached to the top surface of the lower heat sink. The package further has a heat dissipating means for dissipating heat generated from the inner leads. The heat dissipating means has a heat bar attached to the tape. An upper heat sink may be integrated with the heat bar so as to form the heat dissipating means.

7 Claims, 5 Drawing Sheets

SEMICONDUCTOR PACKAGE WITH INTEGRAL HEAT DISSIPATOR

BACKGROUND OF THE INVENTION

1. Field of the Invention

The present invention relates in general to semiconductor packages and, more particularly, to a structural improvement in such semiconductor packages for effectively dissipating heat generated from the leads of the semiconductor packages.

2. Description of the Prior Art

As shown in FIG. 1, a typical semiconductor package PKG includes a plurality of outer leads or terminals OL which mount the semiconductor package PKG to an external circuit board (not shown) thereby electrically connecting the semiconductor package PKG to the external circuit. The above outer leads OL extend from their associated inner leads IL which are enveloped by the package. The inner leads in turn are connected to a semiconductor chip C through a plurality of wires W inside the package PKG. During the circuit operations of the typical semiconductor packages, the elements of the package including the leads OL, IL and the chip generate a large amount of heat. When there is moisture inside the package PKG in the above state, the heat generated from the elements may form either air bubbles or cracks in the package. Furthermore, this heat may break the package. The heat also retards the signal transmitting time of the circuit thereby deteriorating the signal transmitting speed of the circuit.

In order to rectify the above problems, a heat dissipating panel or heat sink $HS_1$ is mounted to the bottom of the semiconductor chip C as shown in FIG. 1 and thereby dissipates heat generated from the chip C.

However, in accordance with recent industry trends of high integration of semiconductor chips and of light, compact semiconductor packages, a larger amount of heat is generated from the package, while the heat dissipating means suitable to use with the package is extremely limited. In this regard, effective heat dissipating means for semiconductor packages has been actively studied recently.

SUMMARY OF THE INVENTION

It is, therefore, an object of the present invention to provide a highly integrated semiconductor package in which the above problems can be overcome and which has a light and compact construction and includes heat dissipating means suitable to effectively dissipate heat generated from the package during the operation of the package.

In order to accomplish the above object, the present invention provides a semiconductor package comprising a lower heat sink for dissipating heat generated from a semiconductor chip of the package, further comprising: a tape attached to the top of a plurality of inner leads of the package, the inner leads being attached to the top of the lower heat sink; and means for dissipating heat generated from the inner leads, the heat dissipating means being provided on the tape.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

In order to effectively dissipate heat generated from the semiconductor package, the semiconductor package PKG according to the present invention is provided with a lower heat dissipating panel or lower heat sink $HS_1$. The lower heat sink $HS_1$ is placed inside the package PKG so as to dissipate heat generated from a semiconductor chip C. A plurality of inner leads IL are attached to the top of the above lower heat sink $HS_1$ by a tape $AT_1$. Attached to the top of the inner leads IL is a tape $AT_2$. In order to fast dissipate heat generated from the inner leads IL to the outside of the package PKG, a heat dissipating means is provided on the above tape $AT_2$.

In the above semiconductor package PKG, the tape $AT_2$ attached to the top of the inner leads IL is made of an electrical insulating material thereby electrically insulating the inner leads IL from each other. However, as the material of the above tape $AT_2$ is thermally conductive, heat generated from the inner leads IL is transferred to a heat dissipating means or heat bars HB through the tape $AT_2$.

Figure 1:
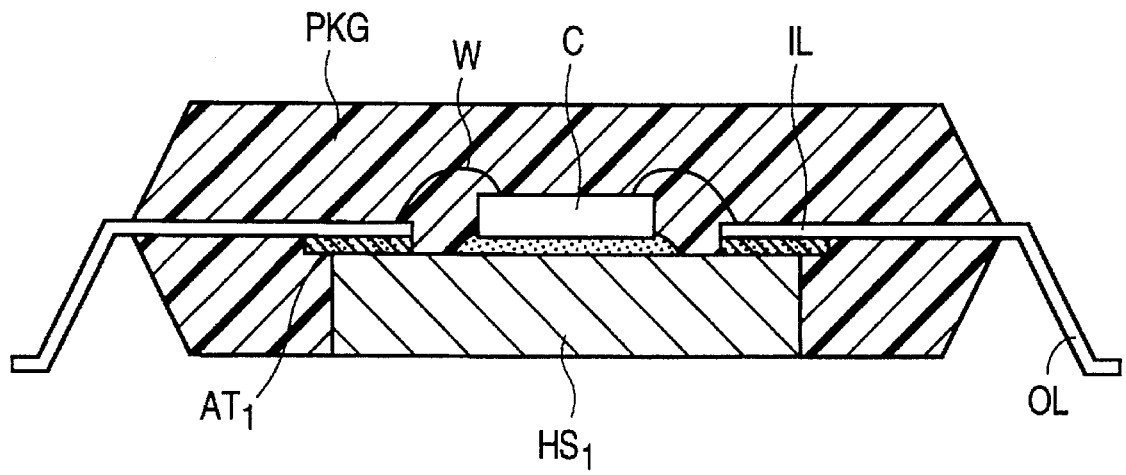
FIG. 1 is a sectional view of a semiconductor package provided with a typical heat sink.
Figure 2:
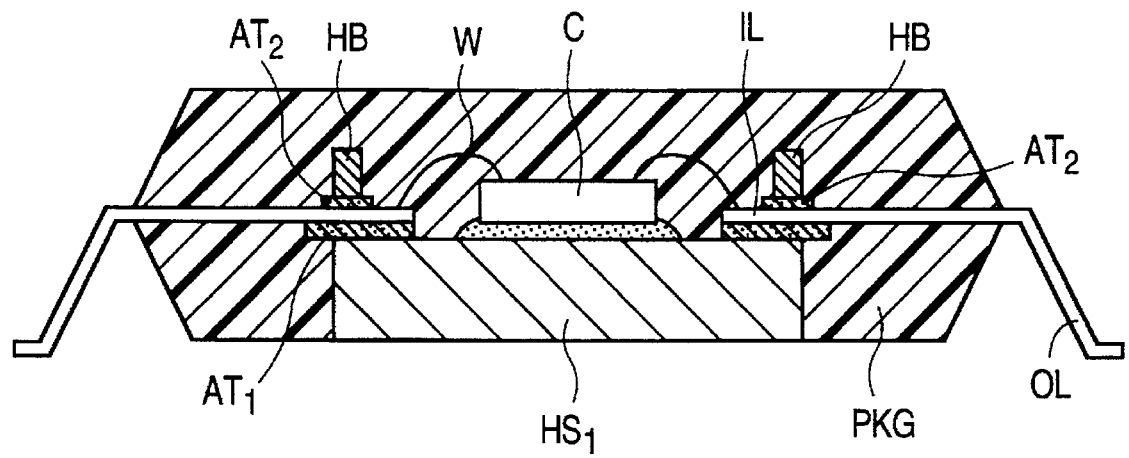
FIG. 2 is a sectional view of a semiconductor package provided with heat bars for dissipating heat generated from the leads of the package in accordance with an embodiment of the present invention.
Figure 4:
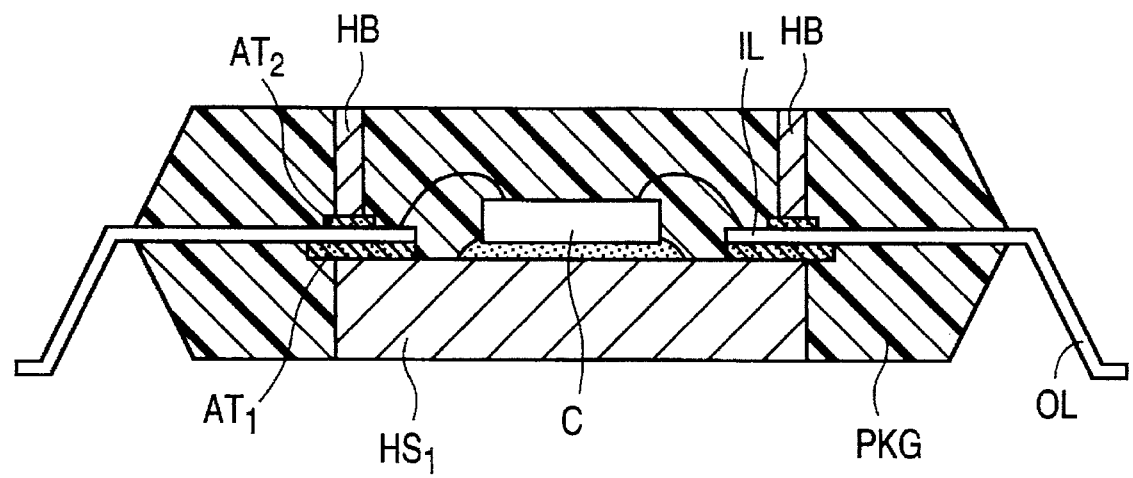
FIG. 4 is a sectional view of a semiconductor package in accordance with a further embodiment of the present invention.

The above heat bars HB which are attached to the top of the tape $AT_2$ may be enveloped by the package PKG as shown in FIG. 2. Alternatively, the above heat bars HB may be enlarged thereby being exposed to the outside of the package PKG as shown in FIG. 4. As a further alternative, the heat bars HB may be further enlarged in order to maximize the heat dissipating effect of the package PKG.

Figure 3:
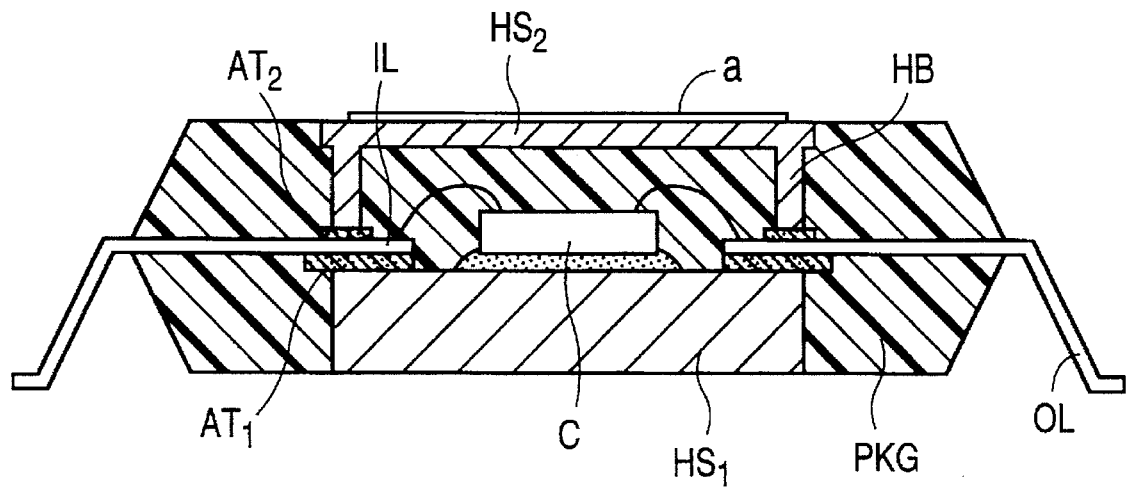
FIG. 3 is a sectional view of a semiconductor package in accordance with another embodiment of the present invention.

In addition, the package PKG of the invention may be provided with an upper heat dissipating panel or upper heat sink $HS_2$ which is placed on the heat bars HB and is integrated with the above heat bars HB into a single body as shown in FIG. 3. In this case, the heat dissipating effect of the package PKG will be further improved. In the above case, the upper heat sink $HS_2$ has a top surface which is exposed to the outside of the package PKG as shown in FIG. 3. The exposed top surface of the upper heat sink $HS_2$ may be provided with a protruding part "a". Alternatively, the upper heat sink $HS_2$ may almost project out of the top of the package PKG so as to maximize the heat dissipating effect of the package.

Figure 5:
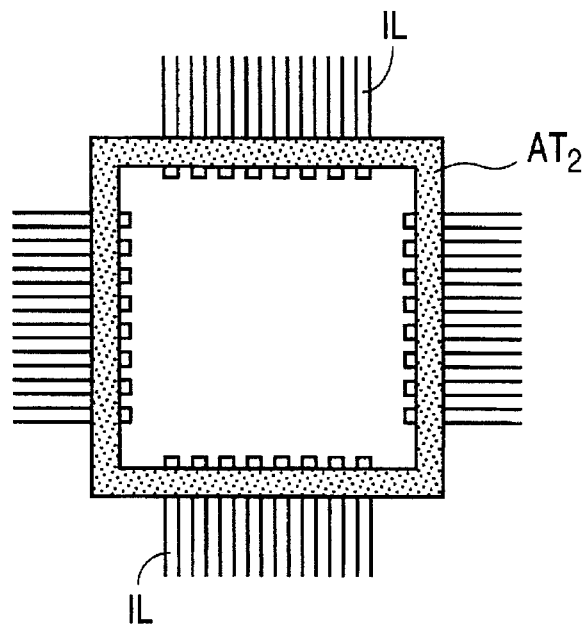
FIG. 5 is a plan view of a lead frame of the semiconductor package of the present invention, showing a tape attached to the inner leads of the lead frame.

FIG. 5 is a plan view of a lead frame of the semiconductor package PKG of the present invention, showing the tape $AT_2$ attached to the inner leads IL of the lead frame. That is, FIG. 5 can be obtained when viewing a package from any among FIGS. 1 to 4 from the top of the package and shows the tape attaching state of the package.

Figure 6:
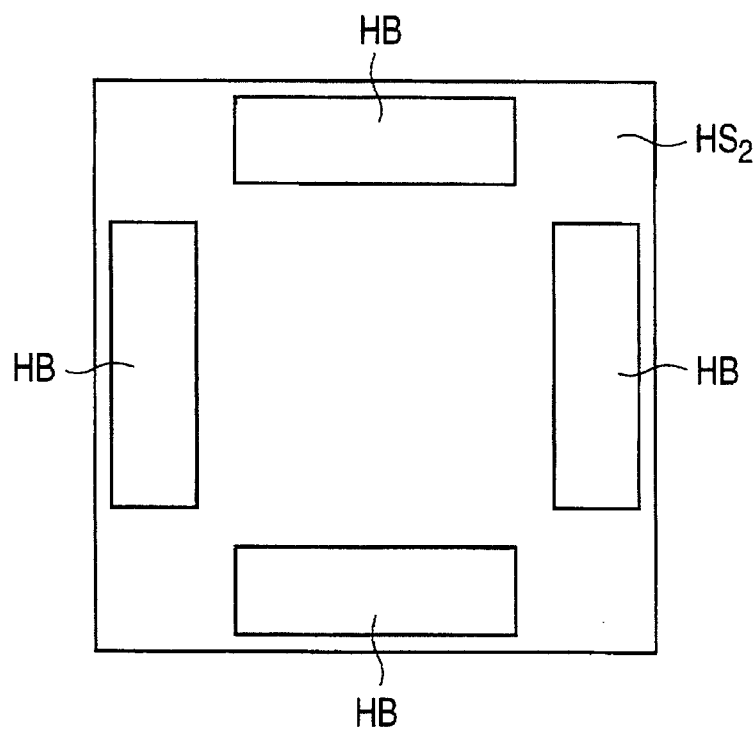
FIG. 6 is a bottom view of an upper heat sink included in the semiconductor package of the present invention.
Figure 7:
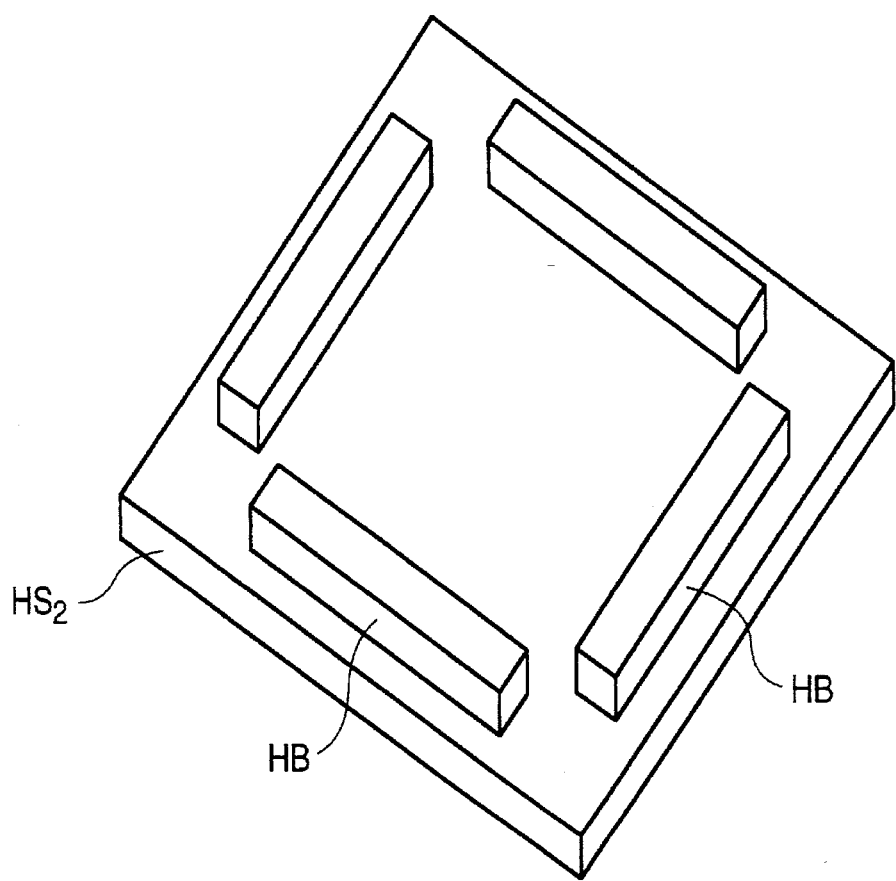
FIG. 7 is a bottom perspective view of the above upper heat sink.

FIGS. 6 and 7 show the heat bars HB provided on the bottom of the upper heat sink $HS_2$.

Figure 8A:
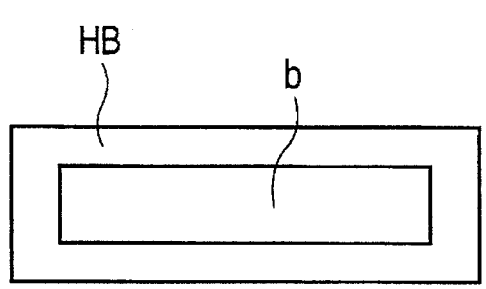
FIGS. 8A and 8B are side views of a heat bar mounted to the leads of the semiconductor package of the present invention.
Figure 8B:
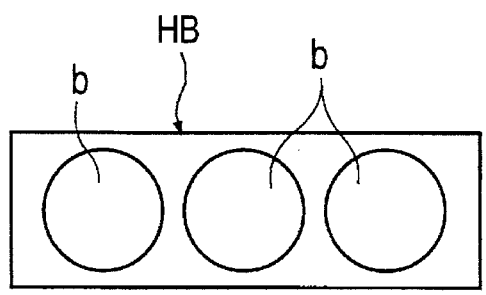
Figure 9A:
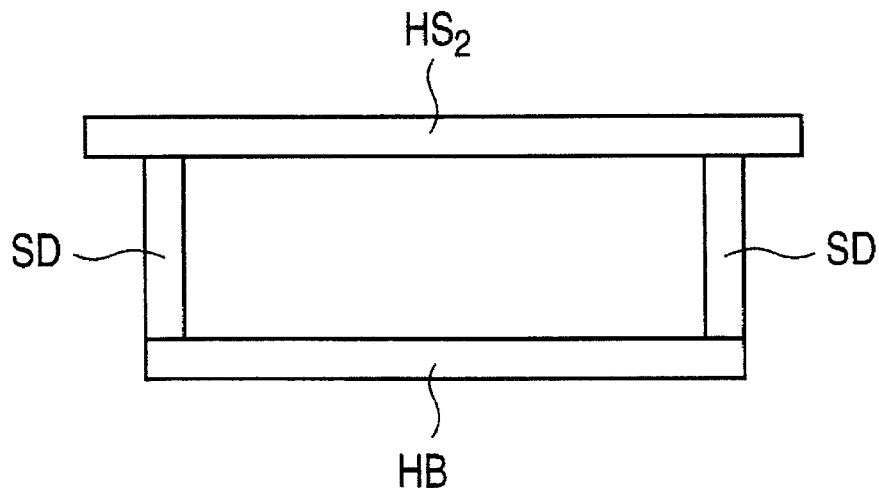
FIGS. 9A and 9B are views of the heat bar and the upper heat sink which are integrated into a single body using support members in accordance with different embodiments of the present invention.
Figure 9B:
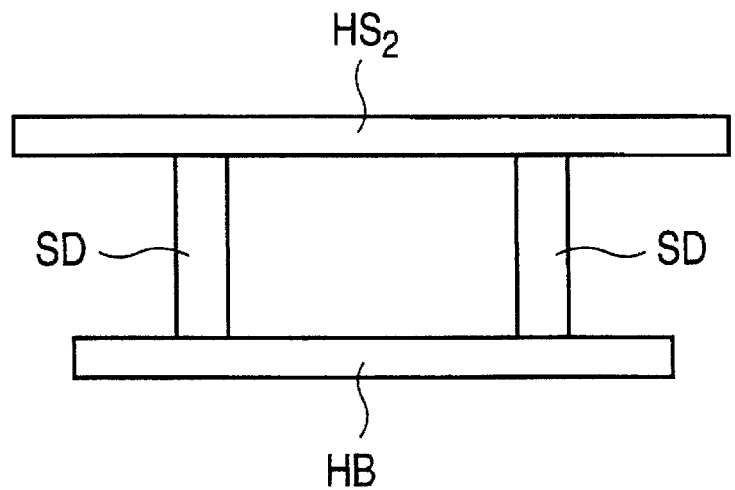

In the present invention, it is preferable to form a plurality of rectangular or circular openings "b" on the side walls of the heat bars HB so as to promote the mold efficiency irrespective of the heat bars HB as shown in FIGS. 8A and 8B. In the above case, the heat bars HB can be prevented from disturbing flow of the molding compound while molding the package PKG. Alternatively, the heat bars HB may be integrated with the upper sink $HS_2$ using support members SD as shown in FIGS. 9A and 9B, thereby allowing a smooth flow of the mold compound while molding the package PKG.

As described above, the present invention provides a semiconductor package which effectively dissipates heat generated from the package. In the package of this invention, a tape is attached to the top of the inner leads of the lead frame. In addition, heat bars along with an upper heat sink which are heat dissipating means are attached to the tape. The package thus effectively dissipates heat, which is generated from the inner leads, through the tape, heat bars and upper heat sink to the outside of the package during the operation of the package. The present invention thus easily prevents the thermal failure of the semiconductor packages, thereby increasing the signal transmitting speed of the circuit and improving the operational performance of the highly integrated semiconductor packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising a first heat sink for dissipating heat generated from a semiconductor chip, said chip being connected to a plurality of inner leads within said package further comprising:

an integral heat dissipator extending across multiple ones of said plurality of inner leads and being attached to a first surface of said plurality of inner leads;

a second surface of said plurality of inner leads being attached to a first surface of said first heat sink; and an electrically insulating, thermally conductive tape attached to said first surface of said plurality of inner leads, said integral heat dissipator being attached to a first surface of said tape and, by said tape, being attached to said first surface of said plurality of inner leads, and wherein said plurality of inner leads comprises spaced sets of said plurality of inner leads; and said integral heat dissipator comprises a series of spaced heat bars, each heat bar overlying one of said sets of said plurality of inner leads.

2. The semiconductor package according to claim 1 further comprising a second heat sink which integrally interconnects said series of spaced heat bars.

3. The semiconductor package according to claim 2 wherein said second heat sink has a first surface which is exposed to the outside of said package.

4. The semiconductor package according to claim 1, wherein each heat bar extends to a position exposed to the outside of said package.

5. The semiconductor package according to claim 3, wherein said first surface of said second heat sink is provided with a protruding part.

6. The semiconductor package according to claim 1, wherein each heat bar is provided with a plurality of circular or polygonal openings on its side wall for allowing smooth flow of mold compound while molding the package.

7. The semiconductor package according to claim 2, wherein a support member is interposed between each heat bar and said second heat sink.

* * * * *